US009478703B2

(12) United States Patent
Sung et al.

(10) Patent No.: US 9,478,703 B2
(45) Date of Patent: Oct. 25, 2016

(54) LIGHT EMITTING DEVICE

(71) Applicant: LG INNOTEK CO., LTD., Seoul (KR)

(72) Inventors: Youn Joon Sung, Seoul (KR); Sung Hoon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/505,910

(22) Filed: Oct. 3, 2014

(65) Prior Publication Data

US 2015/0123158 A1 May 7, 2015

(30) Foreign Application Priority Data

Oct. 4, 2013 (KR) ........................ 10-2013-0118320

(51) Int. Cl.

| | |
|---|---|
| ***H01L 33/46*** | (2010.01) |
| ***H01L 33/10*** | (2010.01) |
| *H01L 33/00* | (2010.01) |

(52) U.S. Cl.

CPC ............... *H01L 33/10* (2013.01); *H01L 33/46* (2013.01); *H01L 33/007* (2013.01); *H01L 2224/48091* (2013.01); *H01L 2224/48247* (2013.01); *H01L 2224/73265* (2013.01); *H01L 2933/0091* (2013.01)

(58) Field of Classification Search

CPC . H01L 33/10; H01L 33/46; H01L 2933/091; H01L 33/43

See application file for complete search history.

(56) References Cited

U.S. PATENT DOCUMENTS

| | | | | |
|---|---|---|---|---|
| 7,071,494 | B2 * | 7/2006 | Steigerwald | H01L 33/22 257/103 |
| 8,274,093 | B2 * | 9/2012 | Park | H01L 21/0237 257/98 |
| 2002/0171090 | A1 * | 11/2002 | Oohata | H01L 25/0753 257/88 |
| 2004/0113166 | A1 * | 6/2004 | Tadatomo | H01L 33/22 257/98 |
| 2004/0232428 | A1 | 11/2004 | Senda et al. | |
| 2005/0173718 | A1 * | 8/2005 | Shin | 257/98 |
| 2006/0137735 | A1 * | 6/2006 | Kobayashi et al. | 136/246 |
| 2011/0095322 | A1 * | 4/2011 | Kang | 257/98 |
| 2011/0127554 | A1 * | 6/2011 | Lee et al. | 257/98 |
| 2012/0056220 | A1 | 3/2012 | Sato et al. | |
| 2012/0299013 | A1 * | 11/2012 | Yu | H01L 33/20 257/77 |

FOREIGN PATENT DOCUMENTS

| | | | |
|---|---|---|---|
| EP | 17681921 | A2 | 3/2007 |
| EP | 2355175 | A2 | 8/2011 |
| WO | WO 2006/112680 | A1 | 10/2006 |
| WO | WO 2009/031857 | A2 | 3/2009 |

OTHER PUBLICATIONS

European Search Report issued in Application No. 14187587.2 dated Feb. 18, 2015.

* cited by examiner

*Primary Examiner* — Yuanda Zhang
*Assistant Examiner* — Michael Carter
(74) *Attorney, Agent, or Firm* — KED & Associates, LLP

(57) ABSTRACT

A light emitting device includes a substrate, a light extraction layer provided over the substrate and a light emitting structure provided over the light extraction layer. The light extraction layer has a refraction index higher than a refraction index of the substrate and lower than a refraction index of the light emitting structure. The light extraction layer has a first region contacting the substrate and a second region provided opposite to the first region. The first region has a greater cross-sectional area than a cross-sectional area of the second region.

23 Claims, 14 Drawing Sheets

100b
160
140
126
124
120
122
150
210a
210b
210
210c
110
B

LIGHT EMITTING DEVICE

CROSS-REFERENCE TO RELATED APPLICATION

This application claims priority under 35 U.S.C. §119 to Korean Application No. 10-2013-0118320 filed on Oct. 4, 2013, whose entire disclosure is hereby incorporated by reference.

BACKGROUND

1. Field

Embodiments relate to a light emitting device and more particularly, to a horizontal light emitting device with improved light extraction efficiency.

2. Background

Light emitting devices such as light emitting diodes or laser diodes using Group III-V or II-VI compound semiconductor materials implement light with a variety of colors such as red, green and ultraviolet light based on thin film growth techniques and development of device materials, implement white light with superior efficacy by using phosphor materials or combining two or more colors and have advantages such as low power consumption, semi-permanent lifespan, high response speed, safety and eco-friendliness, as compared to conventional light sources such as fluorescent lamps and incandescent lamps.

Accordingly, an application range of such a light emitting device has been expanded to transmission modules of optical communication systems, light emitting diodes as replacements for cold cathode fluorescent lamps (CCFLs) constituting backlights of display devices such as liquid crystal displays (LCDs), and white light emitting diode lighting devices as replacements for fluorescent lamps or incandescent lamps, vehicle headlights and traffic lights.

A light emitting device emits light having an energy determined by an inherent energy band of a material constituting an active layer (light emitting layer) upon recombination between electrons injected through a first conductive type semiconductor layer and holes injected through a second conductive type semiconductor layer. A light emitting device package emits light having a longer wavelength than light emitted from the active layer based on excitation of phosphors by light emitted from the light emitting device.

A great deal of research associated with light emitting diodes having a variety of structures is underway to improve luminous efficacy of light emitting devices. Research to improve light extraction efficiency of vertical light emitting devices by forming irregularities on surfaces of light emitting structures is underway and an attempt to improve light extraction efficiency of horizontal light emitting devices by forming a pattern on the surface of an insulating substrate is underway.

However, when irregularities are formed on a surface of an insulating substrate such as sapphire, the semiconductor layer constituting the light emitting structure is readily defected and may not be homogeneously grown due to lattice mismatch between the insulating substrate and the light emitting structure formed thereon, thus causing a decrease in luminous efficacy due to crystal defects present in the semiconductor layer.

BRIEF DESCRIPTION OF THE DRAWINGS

The embodiments will be described in detail with reference to the following drawings in which like reference numerals refer to like elements wherein.

DETAILED DESCRIPTION

Figure 1:
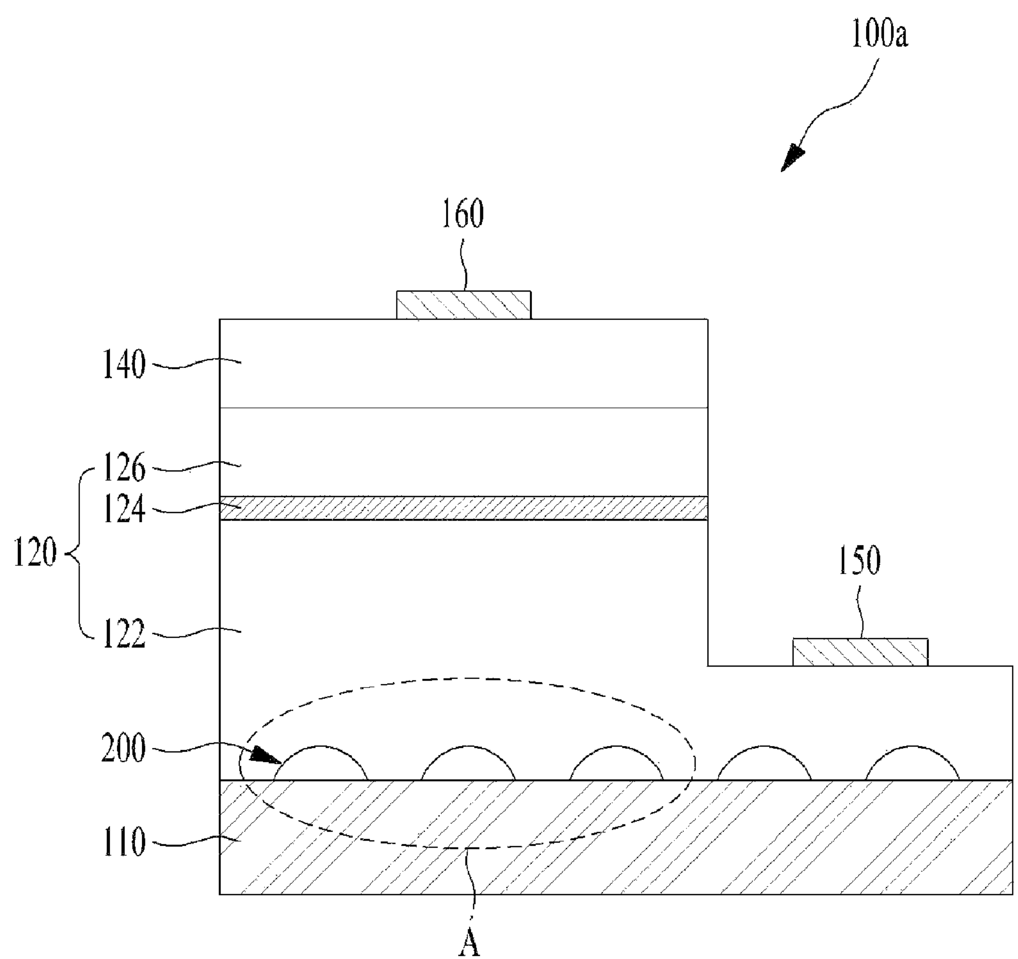
FIG. 1 is a sectional view illustrating a light emitting device according to an embodiment.

FIG. 1 is a sectional view illustrating a light emitting device according to an embodiment. The light emitting device 100*a* shown in FIG. 1 includes a substrate 110, a light extraction layer 200, a light emitting structure 120, a light-transmitting conductive layer 140, a first electrode 150 and a second electrode 160.

The substrate 110 may be formed of a carrier wafer which is a material suitable for growth of semiconductor materials. In addition, the substrate 110 may be formed of a highly thermo-conductive material and may include a conductive substrate or an insulating substrate. For example, the substrate 110 may contain at least one of sapphire ($Al_2O_3$), SiC, Si, GaAs, GaN, ZnO, Si, GaP, InP, Ge and $Ga_2O_3$.

The light extraction layer 200 is a light-transmitting material and may be disposed on the substrate 110, and a refraction index of the light extraction layer 200 is higher than that of the substrate 110 and is lower than that of the light emitting structure 120 formed of GaN or the like. When the light extraction layer 200 is disposed on the entire surface of the substrate 110, growth of GaN on the substrate 110 may be difficult. The light extraction layer 200 will be described later with reference to FIG. 2A, etc.

Although not shown, a buffer layer may be disposed on the substrate 110 to reduce lattice mismatch and difference in coefficient of thermal expansion between the substrate 110 and the light emitting structure 120. The buffer layer may be formed of a Group III-V compound semiconductor, for example, at least one of GaN, InN, AlN, InGaN, AlGaN, InAlGaN and AlInN.

The light emitting structure 120 contacts the substrate 110 and the light extraction layer 200 and includes a first conductive type semiconductor layer 122, an active layer 124 and a second conductive type semiconductor layer 126. A part of the first conductive type semiconductor layer 122 is mesa-etched. The first electrode 150 may be disposed in the etched region, because formation of an electrode under an insulating substrate such as a sapphire substrate may not be possible. In addition, the light extraction layer 200 may be disposed in the entire region of the substrate 110, that is, a region corresponding to the upper surface of the second conductive type semiconductor layer 126 as well as a region corresponding to the surface of the etched and exposed first conductive type semiconductor layer 122.

The first conductive type semiconductor layer 122 may be formed of a semiconductor compound, for example, a Group III-V or Group II-VI semiconductor compound. In addition, the first conductive type semiconductor layer may be doped with a first conductive type dopant. When the first conductive type semiconductor layer is an n-type semiconductor layer, the first conductive type dopant may include Si, Ge, Sn, Se or Te as the n-type dopant, but the disclosure is not limited thereto.

The first conductive type semiconductor layer 122 may for example include a semiconductor material having a formula of $In_xAl_yGa_{1-x-y}N$ ($0 \leq x \leq 1$, $0 \leq y \leq 1$, $0 \leq x+y \leq 1$). The first conductive type semiconductor layer 122 may be formed of at least one of GaN, InN, AlN, InGaN, AlGaN, InAlGaN, AlInN, AlGaAs, InGaAs, AlInGaAs, GaP, AlGaP, InGaP, AlInGaP and InP.

The active layer 124 emits light having an energy determined by an inherent energy band of a material constituting the active layer 124 upon recombination between electrons injected through the first conductive type semiconductor layer 122 and holes injected through the second conductive type semiconductor layer 126.

The active layer 124 may have a multi-quantum well (MQW) structure. For example, the active layer 124 may have a multi-quantum well (MQW) structure formed by injecting trimethyl gallium gas (TMGa), ammonia gas ($NH_3$), nitrogen gas ($N_2$), or trimethyl indium gas (TMIn), but the disclosure is not limited thereto.

The quantum well/quantum barrier of the active layer 124 for example may constitute at least one pair structure of InGaN/GaN, InGaN/InGaN, GaN/AlGaN, InAlGaN/GaN, GaAs(InGaAs)/AlGaAs, GaP(InGaP)/AlGaP, but the disclosure is not limited thereto. The quantum well may be formed of a material having a smaller band gap than that of the quantum barrier.

A conductive clad layer (not shown) may be formed on/under the active layer 124. The conductive clad layer may be formed of a semiconductor having a greater band gap than that of the barrier layer of the active layer 124. For example, the conductive clad layer may include a GaN, AlGaN, InAlGaN, superlattice structure or the like. In addition, the conductive clad layer may be doped with an n-type or p-type dopant.

In addition, the second conductive type semiconductor layer 126 may be formed of a semiconductor compound, for example, a Group III-V or II-VI compound semiconductor and may be doped with a second conductive type dopant. The second conductive type semiconductor layer 126 may for example be a semiconductor material having a formula of $In_xAl_yGa_{1-x-y}N$ ($1 \leq x \leq 1$, $0 \leq y \leq 1$, $0 \leq x+y \leq 1$). When the second conductive type semiconductor layer 126 is a p-type semiconductor layer, the second conductive type dopant includes a p-type dopant, for example, Mg, Zn, Ca, Sr, Ba or the like.

The light-transmitting conductive layer 140 may be disposed on the second conductive type semiconductor layer 126 and facilitate supply of electric current from the second electrode 160 to the second conductive type semiconductor layer 126. The first and second electrodes 150 and 160 may have a single or multiple layer structure including at least one of aluminum (Al), titanium (Ti), chromium (Cr), nickel (Ni), copper (Cu) and gold (Au).

FIGS. 2A to 2D illustrate embodiments of the region "A" of FIG. 1 and a variety of embodiments of the light extraction layer 200. The light extraction layer 200 contacts the substrate 110, may be disposed on the substrate 110 and includes a plurality of light extraction structures, and size and arrangement of the respective light extraction structures may be uniform or non-uniform.

The light extraction layer 200 for example has a refraction index higher than that of the substrate 110, for example, sapphire, and lower than that of a material, for example, GaN, for the light emitting structure 120. As the refraction index of sapphire is 1.8 and the refraction index of GaN is 2.4, the light extraction layer 200 may be formed of a material having a refraction index higher than 1.8 and lower than 2.4, and the light extraction layer 200 may for example include at least one of AlN, SiN, $Ta_2O_5$, $ZrO_2$ and $HfO_2$.

Figure 2A:
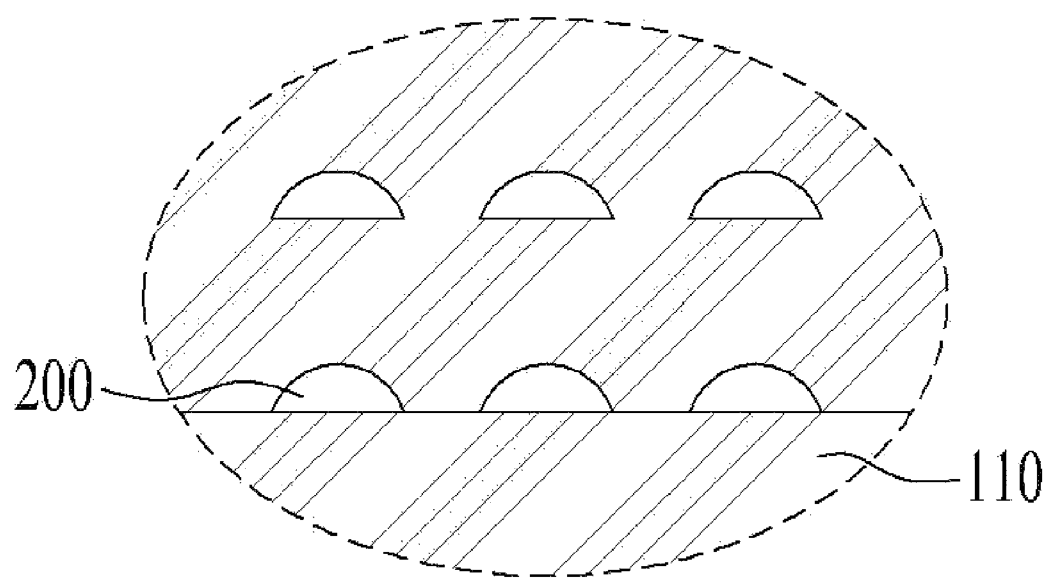
FIGS. 2A to 2D illustrate embodiments of the region "A" of FIG. 1.
Figure 2B:
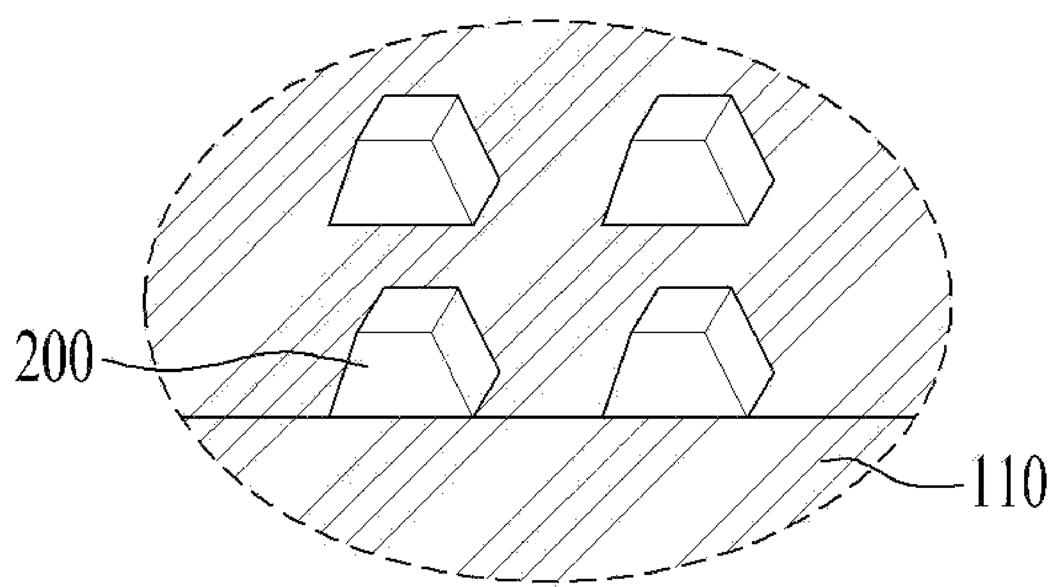
Figure 2C:
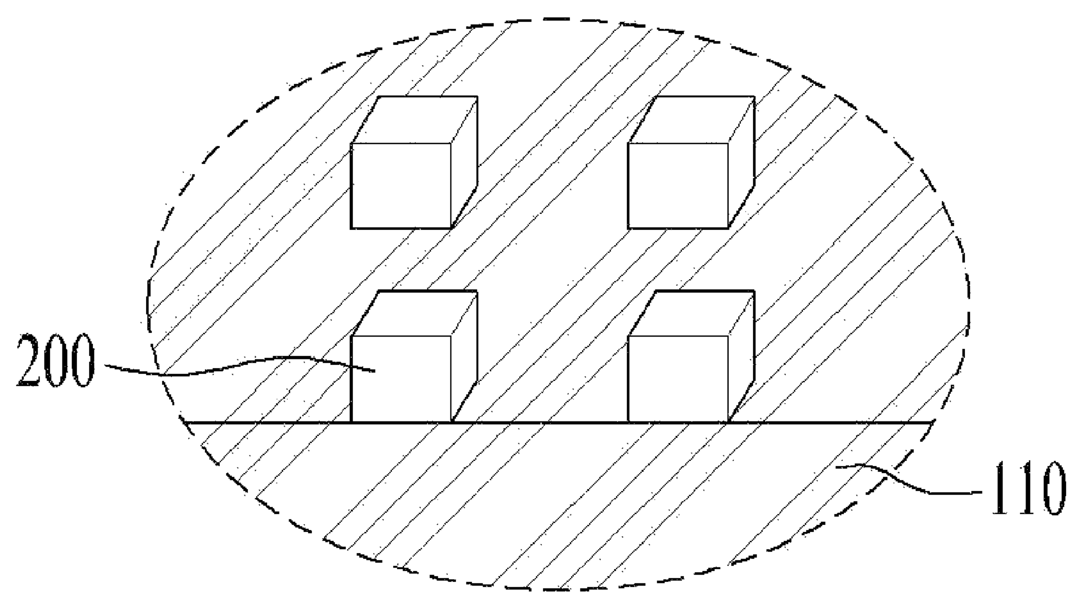
Figure 2D:
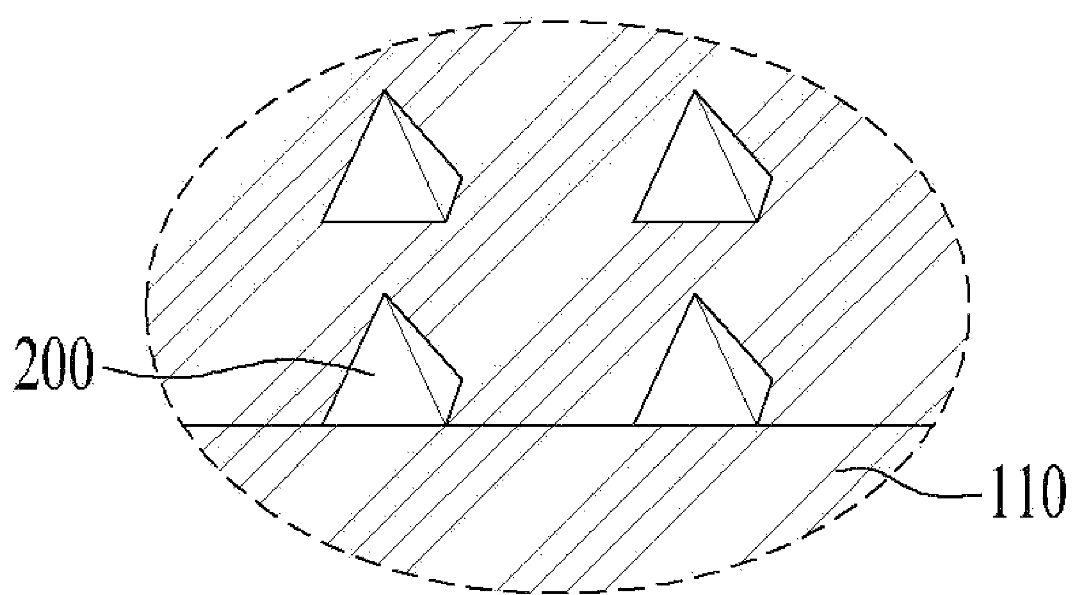

The respective light extraction structures shown in FIG. 2A may have a semispherical shape, the light extraction structures shown in FIG. 2B may have a hexahedral shape having a trapezoidal vertical cross-section, the light extraction structures shown in FIG. 2C may have a hexahedral shape and the light extraction structures shown in FIG. 2D may have a tetrahedral or regular tetrahedral shape.

In the embodiments shown in FIG. 2C, the cross-sectional area of the light extraction structure in the direction of the substrate 110 is the same as the cross-sectional area of the light extraction structure in a direction opposite thereto. In other embodiments, the cross-sectional area of the light extraction structure in the direction of the substrate 110 is greater than the cross-sectional area thereof in the opposite direction. Accordingly, the cross-sectional area of the light extraction layer 200 including the light extraction structures may also be greater than the cross-sectional area thereof in the opposite direction.

Figure 3:
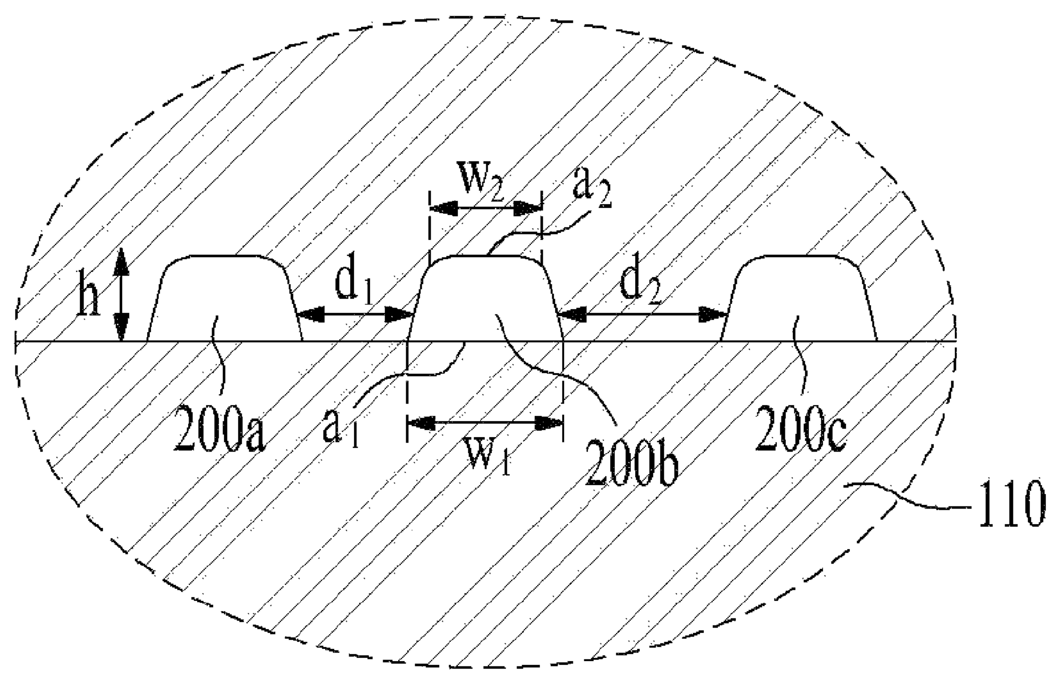
FIG. 3 is a detailed view illustrating disposition of a light extraction structure in a light extraction layer.

FIG. 3 is a detailed view illustrating disposition of the light extraction structure in the light extraction layer. The light extraction structures **200*a* and 200*c* constituting the light extraction layer may have a height h of 1 micrometer to 2 micrometers. When the height h is excessively small or great, improvement in light extraction efficiency may be difficult. That is, when the height h of the light extraction structures 200*a* and 200*c* is less than 1 micrometer, the pattern present on the substrate 110 is excessively small and thus has a plane-like shape, and when the height h is greater than 2 micrometers, the pattern on the substrate 110** is excessively great and light emitted to the outside of the light emitting device is thus non-uniformly distributed.

The distances $d_1$ and $d_2$ between the light extraction structures **200*a* and 200*c* may be 1 micrometer to 2 micrometers and the difference between the distances $d_1$ and $d_2$ between the light extraction structures 200*a* and 200*c*** may be 0.5 micrometers or less.

When the distances $d_1$ and $d_2$ between the light extraction structures **200*a* and 200*c* are excessively small or great, improvement in light extraction efficiency may be difficult. That is, the case in which the distances $d_1$ and $d_2$ between the light extraction structures 200*a* and 200*c* are less than 1 micrometer may not be easily distinguished from the case in which a plurality of light extraction structures 200*a* and 200*c* are continuously formed. When the distances are greater than 2 micrometers, the pattern present on the substrate 110** is excessively small and the effect obtained by formation of the light extraction layer is thus excessively low.

The difference between the distances $d_1$ and $d_2$ between the light extraction structures **200*a* and 200*c*, that is, the gap between the maximum distance between the light extraction structures 200*a* and 200*c* and the minimum distance therebetween ($d_2-d_1$ of FIG. 3) may be 0.5 micrometers or less. When such a difference is greater than the value defined above, manufacturing of the light emitting device is difficult during the process described later and light is non-uniformly reflected from the surface of the substrate 110**, thus causing formation of dark regions.

When a lower part of the light extraction structures 200*a* and 200*c* is defined as a first region $a_1$ and an upper part thereof is defined as a second region $a_2$ in FIG. 3, a width and a length $W_1$ of each of the light extraction structures 200*a* and 200*c* in the first region may be 2 micrometers to 3 micrometers. A width and a length $W_2$ of each of the light extraction structures 200*a* and 200*c* in the second region may be less than the width and length $W_1$. Here, the values $W_1$ and $W_2$ correspond to a side length when the light extraction structures 200*a* and 200*c* have a tetragonal shape, and correspond to a diameter when the light extraction structures 200*a* and 200*c* have a circular shape.

When the value $W_1$ of the light extraction structures 200*a* and 200*c* is less than 2 micrometers or greater than 3 micrometers, improvement of light extraction efficiency may be impossible due to reflection of light at the surface of the substrate 110.

Figure 4:
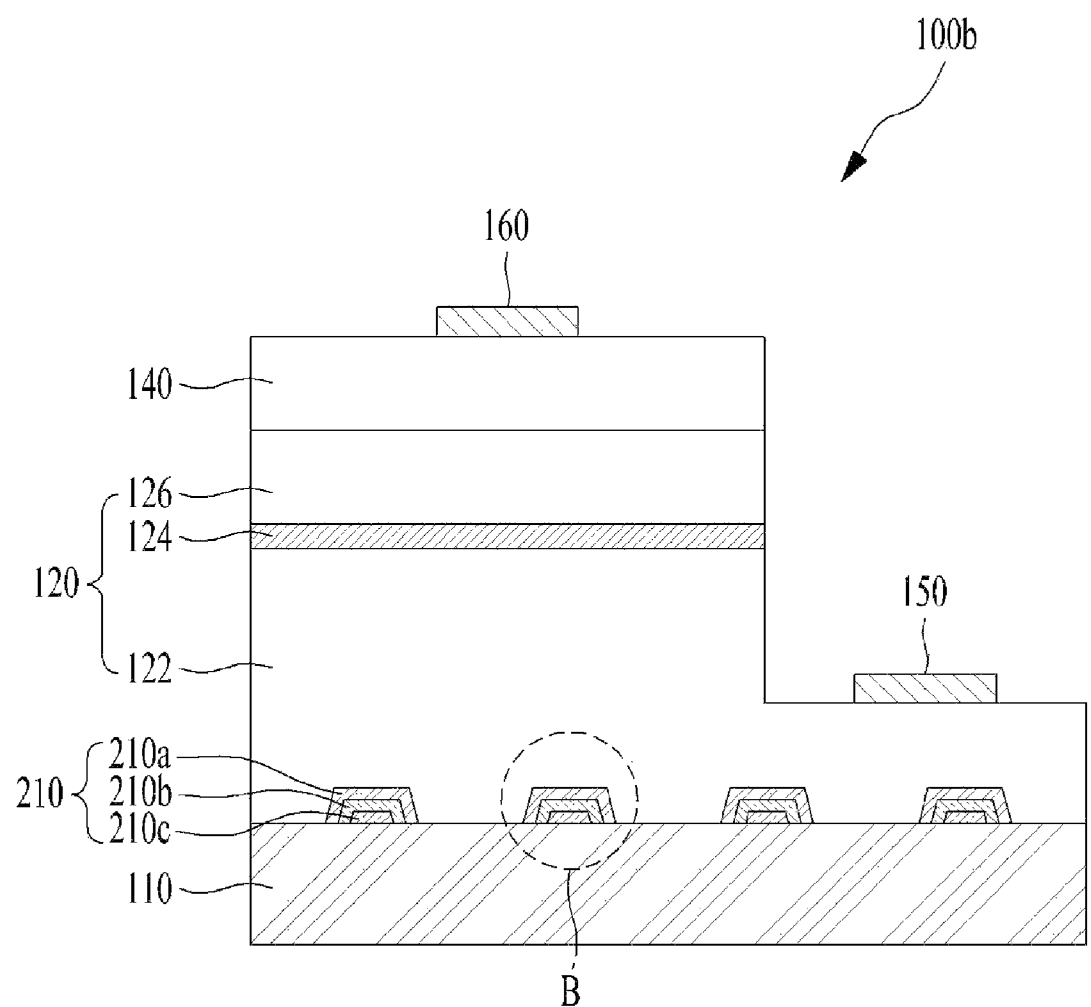
FIG. 4 is a sectional view illustrating a light emitting device according to another embodiment.
Figure 5:
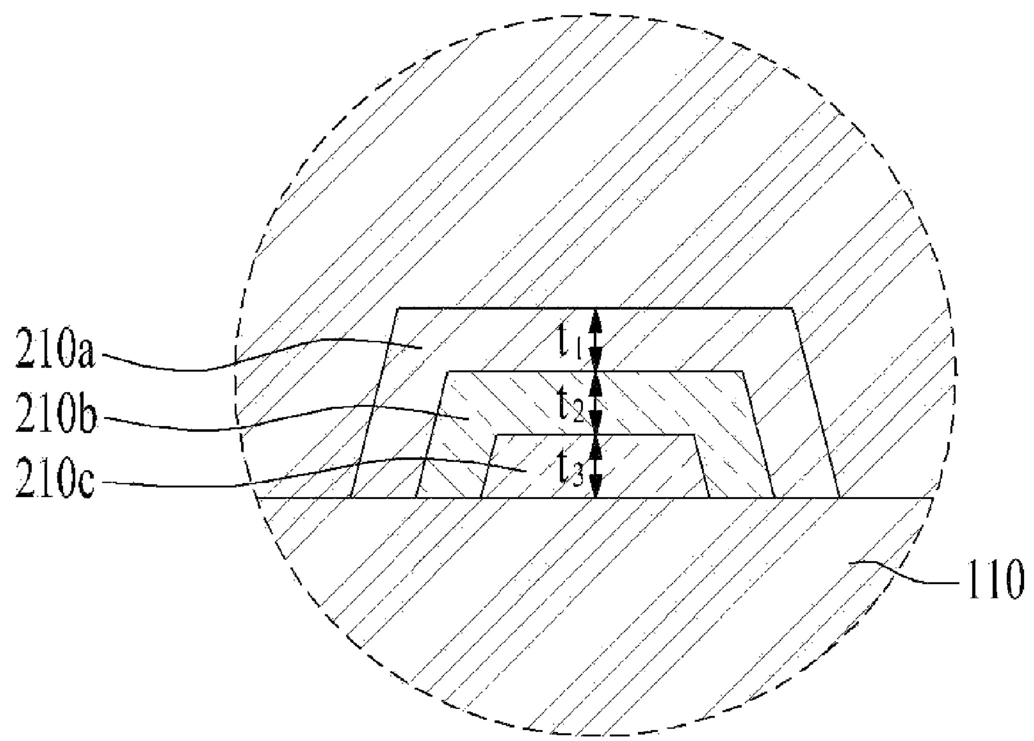
FIG. 5 is a detailed view of the region "B" of FIG. 4.

FIG. 4 is a sectional view illustrating a light emitting device according to another embodiment and FIG. 5 is a detailed view of the region "B" of FIG. 4. The light emitting device 100*b* according to the present invention is similar to that according to the embodiment shown in FIG. 1, but is different therefrom in that the light extraction layer 210 includes a plurality of layers 210*a* to 210*c*. That is, the light extraction layer includes a plurality of light extraction structures in the embodiment described above, while respective light extraction structures constituting the light extraction layer include a plurality of layers 210*a* to 210*c* in the present embodiment.

In FIGS. 4 and 5, the uppermost layer is defined as a first layer 210*a*, the lowermost layer is defined as a third layer 210*c*, the middle layer is defined as a second layer 210*b*, and the first to third layers 210*a*, 210*b* and 210*c* are formed of materials having different refraction indexes. The refraction index of the first layer 210*a* may be lower than that of the light emitting structure 120 and the refraction index of the third layer 210*c* may be greater than that of the substrate 110.

In such a case, the second layer 210*b* is disposed in the direction of the substrate 110 and the first layer 210*a* is disposed in the direction of the light emitting structure 120. That is, the first layer 210*a* is disposed on the second layer 210*b*. Accordingly, the distance between the first layer 210*a* and the light emitting structure 120 is less than the distance between the second layer 210*b* and the light emitting structure 120 and the refraction index of the first layer 210*a* is greater than that of the second layer 210*b* and the refraction index of the second layer 210*b* is greater than that of the third layer 210*c*. In addition, thicknesses $t_1$, $t_2$ and $t_3$ of the first layer 210*a*, the second layer 210*b* and the third layer 210*c* may be identical.

The refraction indexes of the layers 210*a* to 210*c* in the light extraction structure described above may gradually decrease from the light emitting structure 120 toward the substrate 110. Accordingly, light emitted from the active layer 124 in the light emitting structure 120 is total-reflected from the surface of the light extraction structure, thus improving light extraction efficiency of the light emitting device 100*b*.

The light extraction layer 210 may be a distributed Bragg reflector (DBR) including a layer having a relatively great refraction index and a layer having a relatively small refraction index which are alternately disposed. For example, the light extraction layer 210 may have a structure in which $SiO_2$ and $TiO_2$, or $SiO_2$ and $Ta_2O_5$, or $SiO_2$ and AlN are alternately disposed. In this case, the DBR layer serves as a reflective layer and the refraction index of the material constituting the light extraction layer 210 may be different from the refraction index of the substrate 110 and the refraction index of the light emitting structure 120.

The cross-sections of light extraction structures constituting the light extraction layer 210 may have a semispherical shape as well as a variety of shapes as shown in FIGS. 2A to 2D.

Figure 6:
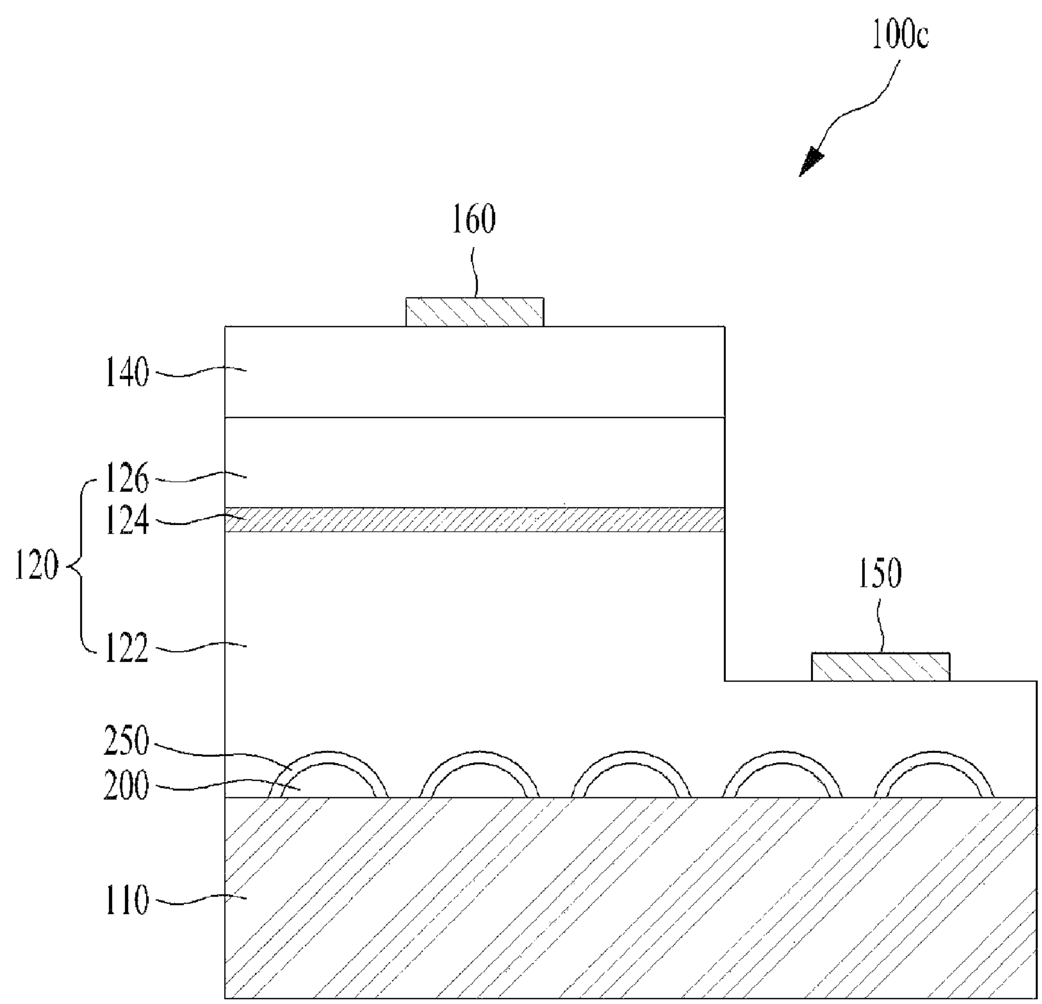
FIG. 6 is a sectional view illustrating a light emitting device according to another embodiment.

FIG. 6 is a sectional view illustrating a light emitting device according to another embodiment. The light emitting device 100*c* according to the present embodiment is similar to that according to the embodiment shown in FIG. 1, except that a reflective layer 250 may be on the surface of the light extraction layer 200. The reflective layer 250 may be between the surface of the light extraction layer 200 and the light emitting structure 120 to reflect light transferred from the active layer 124. The reflective layer 250 may be formed of aluminum (Al), silver (Ag) or the like.

Since the reflective layer 250 is disposed such that it covers the surface of the light extraction layer 200, the lower surface of the light extraction layer 200 contacts the substrate 110, the side and upper surfaces thereof contact the reflective layer 250 and the light extraction layer 200 does not contact the light emitting structure 120.

In the light emitting device according to another embodiment, in addition to the embodiment shown in FIG. 1, the reflective layer 250 of FIG. 6 may be disposed on the light extraction layer.

FIGS. 7A to 7D are sectional views illustrating a method for manufacturing a light emitting device according to an embodiment.

Figure 7A:
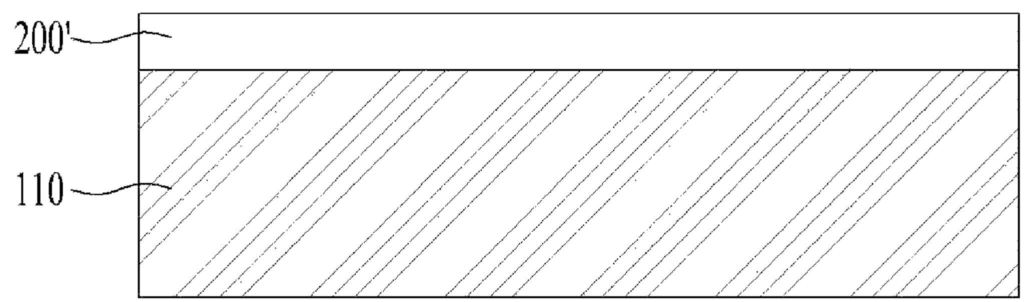
FIG. 7A to FIG. 7D are sectional views illustrating a method for manufacturing a light emitting device according to an embodiment.

As shown in FIG. 7A, a light extraction layer material 200' is disposed on the substrate 110. As described above, the substrate 110 may be formed of a non-conductive material such as sapphire and the light extraction layer 200' may be formed of AN or the like, as described above. The light extraction layer 200' may be deposited by PECVD, sputtering, ion beam deposition or the like.

Figure 7B:
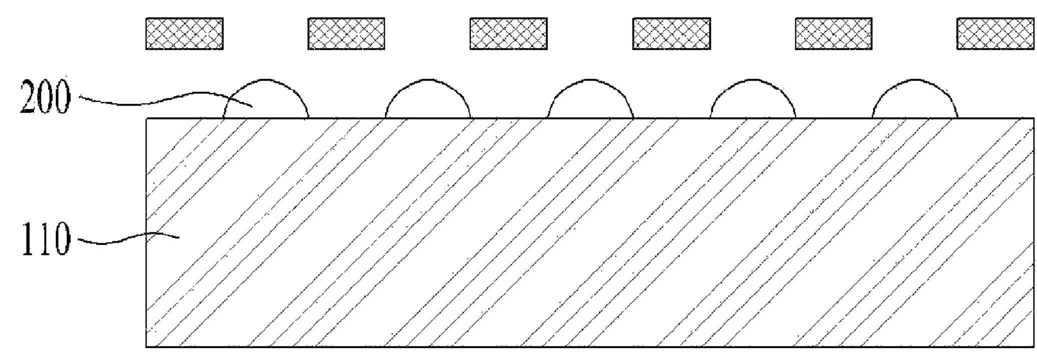

As shown in FIG. 7B, a light extraction layer 200 may be selectively formed on the substrate 110 using a mask. The disposition of the light extraction layer 200 may be changed according to disposition of the mask.

Figure 7C:
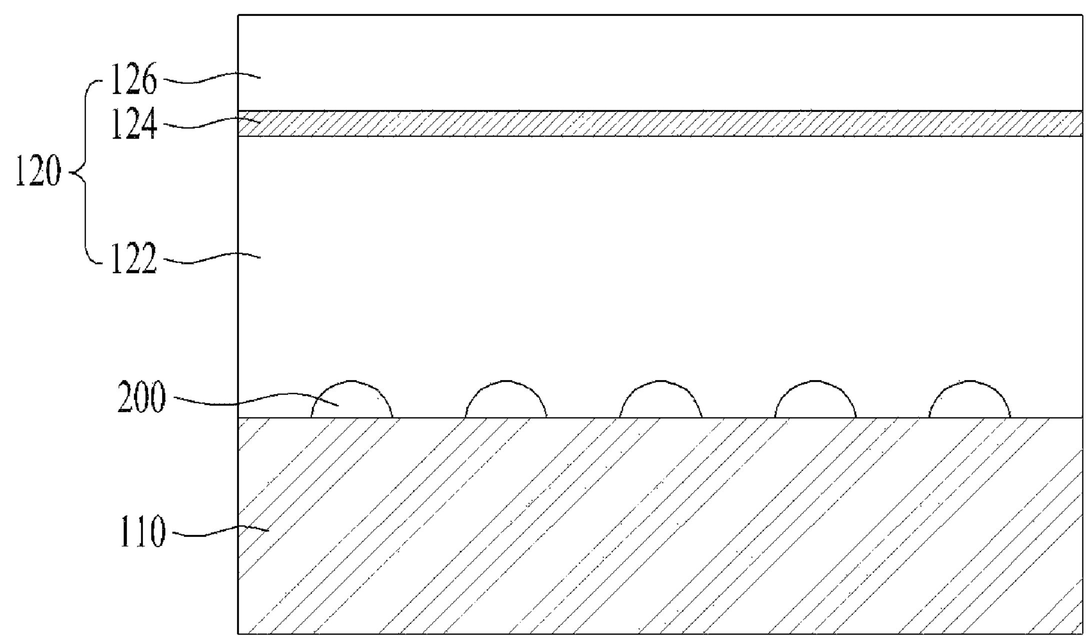

As shown in FIG. 7C, a first conductive type semiconductor layer 122, an active layer 124 and a second conductive type semiconductor layer 126 are grown on the substrate 110 and the light extraction layer 200 to form a light emitting structure 120.

Regarding the first conductive type semiconductor layer 122 constituting the light emitting structure 120, an AlGaN layer doped with an n-type dopant may be formed using a method such as chemical vapor deposition (CVD), molecular beam epitaxy (MBE), sputtering or hydride vapor phase epitaxy (HYPE). The first conductive type semiconductor layer 122 may be formed by injecting trimethyl gallium gas (TMGa), ammonia gas ($NH_3$), nitrogen gas ($N_2$) and silane gas ($SiH_4$) containing an n-type impurity such as silicon (Si).

The active layer 124 may have a multi-quantum well (MQW) structure formed by injecting trimethyl gallium gas (TMGa), ammonia gas ($NH_3$), nitrogen gas ($N_2$), or trimethyl indium gas (TMIn), but the disclosure is not limited thereto. The second conductive type semiconductor layer 126 may have the same composition as described above and may be a p-type GaN layer formed by injecting trimethyl gallium gas (TMGa), trimethyl aluminum gas (TMAl), or bicetylcyclopentadienyl magnesium ($EtCp_2Mg$) {Mg $(C_2H_5C_5H_4)_2$} into a chamber, but the disclosure is not limited thereto.

Figure 7D:
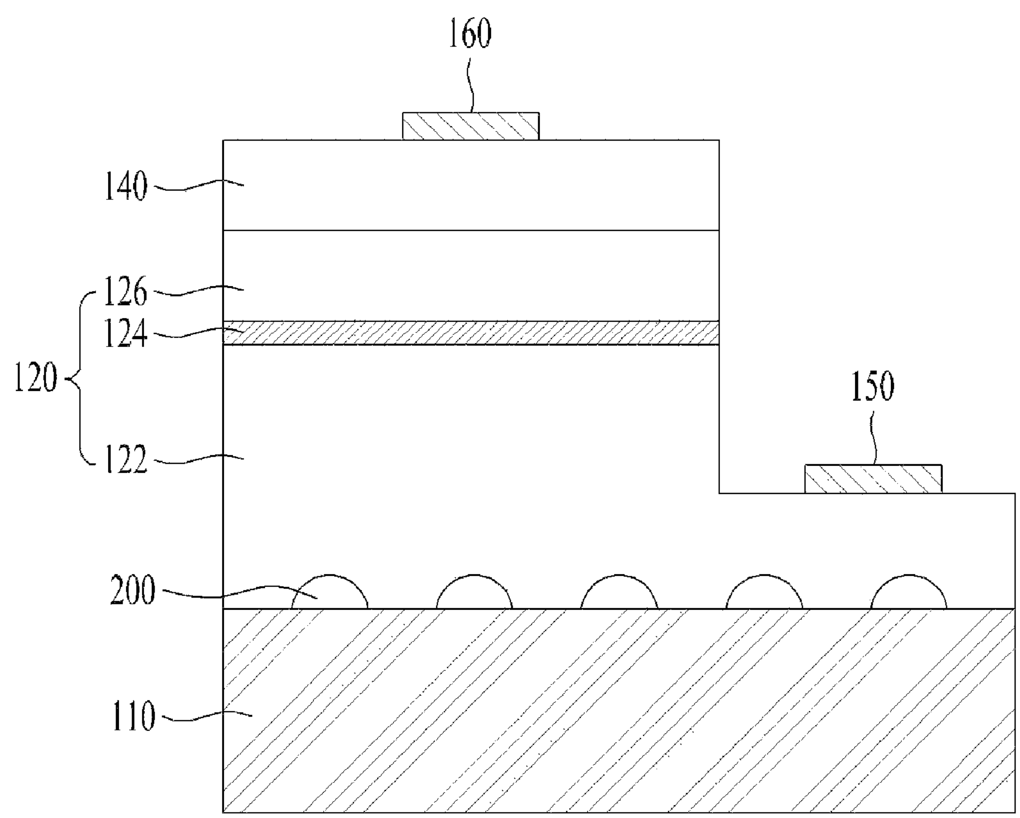

As shown in FIG. 7D, parts of the second conductive type semiconductor layer 126, and the active layer 124 and the first conductive type semiconductor layer 122 are etched using a mask or the like to expose the part of the first conductive type semiconductor layer 122. A first electrode 150 and a second electrode 160 are formed on the exposed first conductive type semiconductor layer 122 and second conductive type semiconductor layer 126. At this time, in order to facilitate supply of current from the second electrode 160 to the second conductive type semiconductor layer 126, ITO or the like may be disposed as a light-transmitting conductive layer 140.

The light emitting devices according to the embodiments may have a configuration in which the light extraction layer is formed between the light emitting structure and the substrate to reflect light transferred from the active layer toward the substrate and thereby improve light extraction efficiency. In addition, the light extraction layer may be formed as a DBR layer, or the refraction index gradually decreases from the light emitting structure toward the substrate, thereby maximizing light extraction efficiency.

Figure 8:
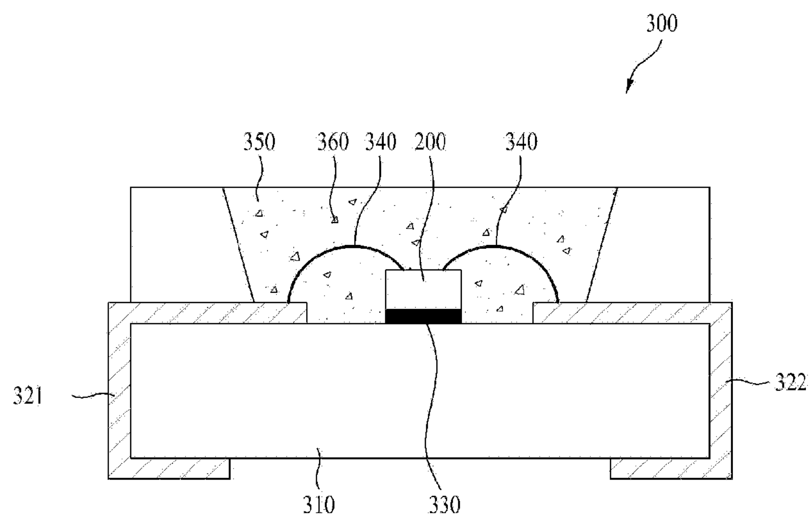
FIG. 8 is a sectional view illustrating a light emitting device package according to an embodiment.

FIG. 8 is a sectional view illustrating a light emitting device package according to an embodiment. The light emitting device package 300 includes a body 310 provided with a cavity, a first lead frame 321 and a second lead frame 322 provided on the body 310, the light emitting device 100 according to any one of the afore-mentioned embodiments provided in the body 310, and electrically connected to the first lead frame 321 and the second lead frame 322, and a molding portion 350 provided in the cavity.

The body 310 contains silicon, a synthetic resin or a metal. When the body 310 is made of a conductive material such as metal, although not shown, an insulating material is coated on the surface of the body 310 to prevent short-circuit between the first and second lead frames 321 and 322.

The first lead frame 321 and the second lead frame 322 are electrically separated and supply electric current to the light emitting device 100. In addition, the first lead frame 321 and the second lead frame 322 reflect light emitted the light emitting device 100 to improve optical efficiency and discharge heat generated in the light emitting device 100

The light emitting device 100 may be fixed to the body 310 by a conductive adhesive 330, or mounted on the first lead frame 321 or the second lead frame 322. In this embodiment, the first lead frame 321 and the light emitting device 100 directly communicate with each other, and the second lead frame 322 and the light emitting device 100 are connected to each other through a wire 230. The light emitting device 100 may be connected to the lead frames 321 and 322 by flip chip bonding or die-bonding in addition to wire bonding.

The light emitting device 100 may be provided alone as described above or as a light emitting device array including three or more light emitting devices, and may be the light emitting device with improved light extraction efficiency according to the embodiment described above.

The molding portion 350 surrounds the light emitting device 100 to protect the same. In addition, a phosphor 360 is conformally coated as a layer separate from the molding portion 350 on the molding portion 350. Such a configuration converts a wavelength of light emitted from the light emitting device 100 due to uniform distribution of the phosphor 360 over the entire area in which light of the light emitting device package 300 is emitted.

Light of a first wavelength region emitted from the light emitting device 100 is excited by the phosphor 360 and is transformed into light of a second wavelength region, and the light of the second wavelength range passes through a lens (not shown) to change a light passage.

A plurality of the light emitting devices according to the embodiments described above may be mounted on the light emitting device package and optical members, i.e., light guide plates, prism sheets, diffusion sheets, or the like may be disposed in the light passage of the light emitting device packages. The light emitting device package, substrate and optical members may serve as light units. Another embodiment may be implemented with a display device, an indication device and a lighting system including the semiconductor light emitting device or light emitting device package mentioned in the previous embodiments and examples of the lighting system may include lamps, streetlights and the like.

Figure 9:
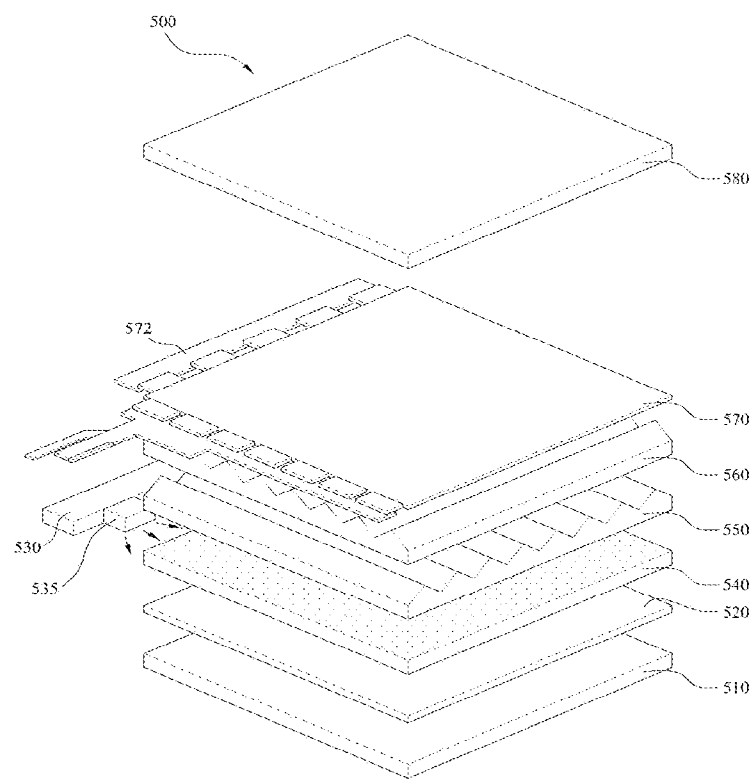
FIG. 9 illustrates an image display device including the light emitting device according to an embodiment.

FIG. 9 is a view illustrating an image display device including the light emitting device according to an embodiment. The image display device 500 according to the present embodiment includes a light source module, a reflective plate 520 disposed on a bottom cover 510, a light guide plate 540 disposed in front of the reflective plate 520 to direct light emitted from the light source module toward the front of the image display device, an optical sheet including prism sheets 550 and 560 disposed in front of the light guide plate 540, a panel 570 disposed in front of the second prism sheet 560, and a color filter 580 disposed in front of the panel 570.

The light source module includes the light emitting device packages 535 mounted on a circuit substrate 530. The circuit substrate 530 may be a PCB or the like and the light emitting device packages 535 have superior light extraction efficiency, as described above.

The bottom cover 510 may accommodate constituent components of the image display device 500. The reflective plate 520 may be provided as a separate element, as illustrated in the drawing, or may be provided as a coating with a material having a high reflectivity provided on the back surface of the light guide plate 540 or the front surface of the bottom cover 510.

Here, the reflective plate 520 may be made of a highly reflective material suitable for use as an ultra-thin film form and the material is for example polyethylene terephthalate (PET).

The light guide plate 540 scatters light emitted from the light emitting device package to uniformly distribute the light over the entire region of the screen of the liquid crystal display. Accordingly, the light guide plate 540 may be formed of a material having a high reflective index and high transmittance such as polymethylmethacrylate (PMMA), polycarbonate (PC) or polyethylene (PE). In addition, an air guide-type display device may be implemented when the light guide plate 540 is omitted.

The first prism sheet 550 is formed at a side of the support film using a light-transmitting and elastic polymer and the polymer may have a prism layer having a plurality of repeatedly formed three-dimensional structures. Here, the plurality of patterns, as illustrated in the drawing, may be provided as stripe patterns including repeatedly disposed ridges and valleys.

The direction of the ridges and valleys on a surface of the support film in the second prism sheet 560 may be perpendicular to the direction of ridges and valleys on the surface of the support film in the first prism sheet 550. This aims to uniformly distribute light transferred from the light source module and the reflective sheet in all directions of the panel 570.

In the present embodiment, the first prism sheet 550 and the second prism sheet 560 constitute an optical sheet. The optical sheet may be provided as another combination such as a micro lens array, a combination of a diffusion sheet and a micro lens array, or a combination of one prism sheet and a micro lens array.

A liquid crystal display may be disposed in the panel 570 and other display devices requiring a light source in addition to the liquid crystal display 560 may be provided. The panel 570 has a structure in which liquid crystal is interposed between two glass bodies and a polarization plate is mounted on the glass bodies to utilize polarization of light. Liquid crystal has an intermediate property between a liquid and a solid. Liquid crystal is a flowable organic molecule like a liquid and is regularly arranged like a crystal. Images are displayed based on change of the molecular arrangement of the liquid crystal due to an applied electric field. The liquid crystal display used for display devices may be of an active matrix-type and use a transistor as a switch to control voltage supplied to each pixel.

The color filter 580 is provided on the front surface of the panel 570 so that red, green or blue light among light projected from the panel 570 is selectively transmitted through each pixel and an image is displayed.

Figure 10:
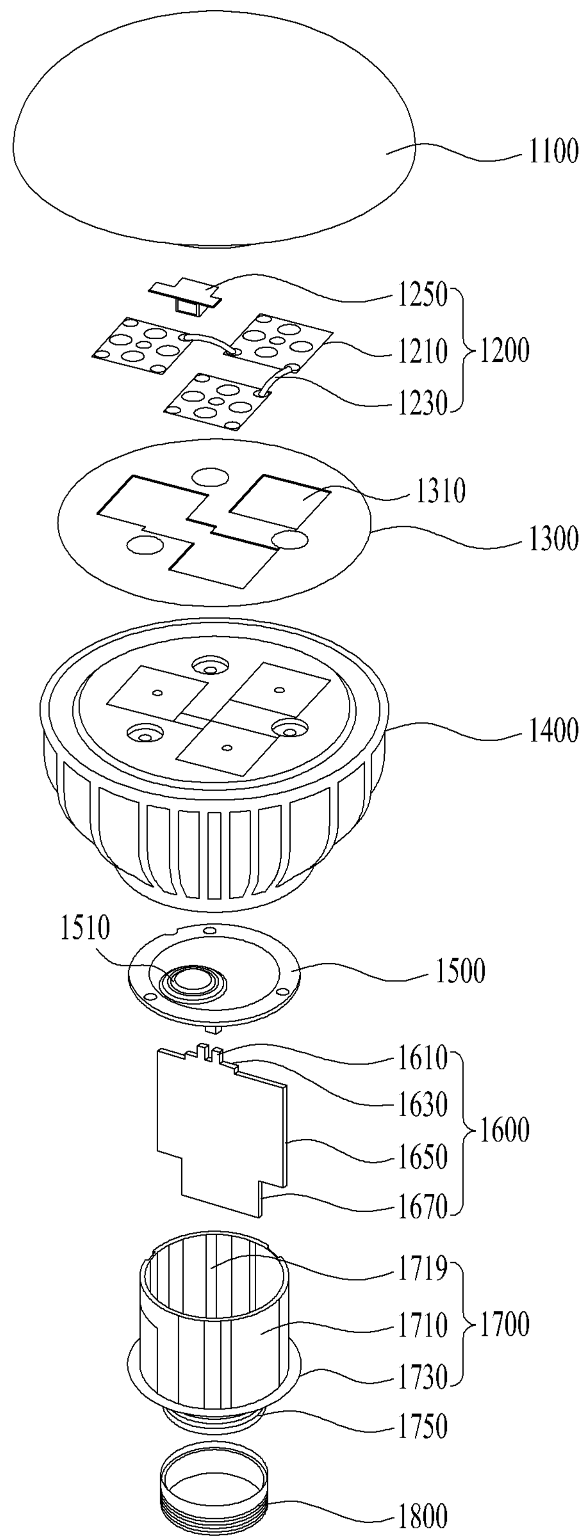
FIG. 10 illustrates a lighting device including the light emitting device according to an embodiment.

FIG. 10 illustrates a lighting device including the light emitting device according to an embodiment. The lighting device according to the present embodiment may include a cover 1100, a light source module 1200, a heat radiator 1400, a power supply 1600, an inner case 1700 and a socket 1800. In addition, the lighting device 1000 according to the embodiment may further include one or more of a member 1300 and a holder 1500. The light source module 1200 may include the light emitting device package 100 according to the embodiments described above, thus exhibiting light extraction efficiency of the light emitting device.

The cover 1100 may have a bulb or hemispherical shape and may be a hollow having an open part. The cover 1100 may be optically bonded to the light source module 1200. For example, the cover 1100 may diffuse, scatter or excite light supplied from the light source module 1200. The cover 1100 may be an optical member. The cover 1100 may be connected to the heat radiator 1400. The cover 1100 may have a connection portion for connection to the heat radiator 1400.

The inner surface of the cover 1100 may be coated with an ivory white coating material. The ivory white coating material may include a diffusion material for diffusing light. A surface roughness of the inner surface of the cover 1100 may be greater than that of the outer surface of the cover 1100. The reason for this is that light is sufficiently scattered and diffused from the light source module 1200 and is discharged to the outside.

The cover 1100 may be formed of a material such as glass, plastic, polypropylene (PP), polyethylene (PE), polycarbonate (PC) or the like. Polycarbonate has light resistance, heat resistance and strength. The cover 1100 may be transparent so that the light source module 1200 is visible from the outside, but the disclosure is not limited thereto and the cover 1100 may be non-transparent. The cover 1100 may be formed by blow molding.

The light source module 1200 may be disposed on a surface of the heat radiator 1400 and heat generated by the light source module 1200 may be transferred to the heat radiator 1400. The light source module 1200 may include a plurality of light source units 1210, a connection plate 1230 and a connector 1250.

The member 1300 may be disposed on the upper surface of the heat radiator 1400 and have a guide groove 1310 through which the light source units 1210 and the connector 1250 are inserted. The guide groove 1310 may correspond to the substrate of the light source units 1210 and the connector 1250.

A light-reflecting material may be applied or coated on the surface of the member 1300. For example, a white coating material may be applied or coated on the surface of the member 1300. The member 1300 reflects light, which is reflected by an inner surface of the cover 1100 and returns to the light source module 1200, in the direction of the cover 1100. Accordingly, luminous efficacy of the lighting device according to the embodiment is improved.

The member 1300 is for example formed of an insulating material. The connection plate 1230 of the light source module 1200 may include an electrically conductive material. Accordingly, the heat radiator 1400 may electrically contact the connection plate 1230. The member 1300 is composed of an insulating material, thus blocking electrical short-circuit between the connection plate 1230 and the heat radiator 1400. The heat radiator 1400 receives heat from the light source module 1200 and heat from the power supply 1600 and dissipates the same.

The holder 1500 covers the accommodation groove 1719 of the insulation unit 1710 of the inner case 1700. Accordingly, the power supply 1600 accommodated in the insulation unit 1710 of the inner case 1700 may be sealed. The holder 1500 may have a guide protrusion 1510 and the guide protrusion 1510 may have a hole through which the protrusion 1610 of the power supply 1600 penetrates.

The power supply 1600 processes or converts an electrical signal supplied from the outside and supplies the same to the light source module 1200. The power supply 1600 may be accommodated in the accommodation groove 1719 of the inner case 1700 and may be sealed in the inner case 1700 by the holder 1500. The power supply 1600 may include a protrusion 1610, a guide portion 1630, a base 1650 and an extension portion 1670.

The guide portion 1630 may protrude outwardly from a side of the base 1650. The guide portion 1630 may be inserted into the holder 1500. A plurality of elements may be disposed on a surface of the base 1650. Examples of the elements include, but are not limited to, a direct current convertor that converts alternating current supplied from an exterior power source into direct current, a driving chip to control driving of the light source module 1200, an electrostatic discharge (ESD) protective element to protect the light source module 1200 from electrical shock or the like.

The extension portion 1670 protrudes outwardly from another side of the base 1650. The extension portion 1670 may be inserted into the connection portion 1750 of the inner case 1700 and may receive an electrical signal from the outside. For example, a width of the extension portion 1670 may be less than or equal to that of the connection portion 1750 of the inner case 1700. One terminal of each of a positive (+) wire and a negative (−) wire is electrically connected to the extension portion 1670 and the other terminal thereof is electrically connected to the socket 1800.

The inner case 1700 may include a molding portion in addition to the power supply 1600. The molding portion is an area formed by hardening a molding liquid and fixes the power supply 1600 to an inner area of the inner case 1700.

As apparent from the foregoing, the light emitting device according to the embodiment has a configuration in which the light extraction layer is formed between the light emitting structure and the substrate to reflect light transferred from the active layer to the substrate and thereby improve light extraction efficiency. In addition, the light extraction layer is provided as a DBR layer so that a refraction index gradually decreases from the light emitting structure to the substrate and light extraction efficiency is thus maximized.

Embodiments provide a light emitting device with an improved light extraction efficiency.

In one embodiment, a light emitting device includes a substrate, a light extraction layer disposed on the substrate, the light extraction layer having a refraction index higher than a refraction index of the substrate and lower than a refraction index of a light emitting structure and including a first region contacting the substrate and a second region disposed opposite to the first region, the first region having a greater cross-sectional area than a cross-sectional area of the second region, and the light emitting structure disposed on the substrate and the light extraction layer, the light emitting structure including a first conductive type semiconductor layer, a second conductive type semiconductor layer and an active layer.

The light extraction layer may include a plurality of light extraction structures and the respective light extraction structures include a first region contacting the substrate and a second region disposed opposite to the first region, wherein the first region has a greater cross-sectional area than a cross-sectional area of the second region.

The respective light extraction structures may have a height of 1 micrometer to 2 micrometers.

The respective light extraction structures may be spaced from one another by a predetermined distance of 1 micrometer to 2 micrometers.

A difference in distances between the light extraction structures may be 0.5 micrometers or less.

The respective light extraction structures in the first region may have a width of 2 to 3 micrometers and a length of 2 to 3 micrometers.

The light emitting device may further include a reflective layer disposed between the light extraction layer and the light emitting structure.

The light extraction layer may include a first layer disposed in a direction of the light emitting structure and a second layer disposed in a direction of the substrate.

The first layer may have a higher refraction index than a refraction index of the second layer.

The light extraction layer may be a DBR layer.

In another embodiment, a light emitting device includes a substrate, a light extraction layer disposed on the substrate, the light extraction layer having a refraction index higher than a refraction index of the substrate and lower than a refraction index of a light emitting structure, a reflective layer disposed on the light extraction layer, and the light emitting structure being disposed on the substrate and the light extraction layer, the light emitting structure including a first conductive type semiconductor layer, a second conductive type semiconductor layer and an active layer.

The light extraction layer may have a lower surface contacting the substrate.

The light extraction layer may have a side surface and an upper surface, each contacting the reflective layer.

The refraction index of the first layer may be less than the refraction index of the light emitting structure.

The refraction index of the second layer may be greater than the refraction index of the substrate.

The light emitting structure may have a configuration in which parts of the second conductive type semiconductor layer, the active layer and the first conductive type semiconductor layer may be etched to expose the part of a surface of the first conductive type semiconductor layer, and the light extraction layer may be disposed in a region corresponding to an upper surface of the second conductive type semiconductor layer and a region corresponding to the etched and exposed surface of the first conductive type semiconductor layer.

In another embodiment, a light emitting device includes a substrate, a light extraction layer disposed on the substrate, the light extraction layer including a first layer disposed in a direction of the light emitting structure and a second layer disposed in a direction of the substrate, and a light emitting structure disposed on the substrate and the light extraction layer, the light emitting structure including a first conductive type semiconductor layer, an active layer and a second conductive type semiconductor layer, wherein the second layer has a greater refraction index than a refraction index of the substrate, the first layer has a greater refraction index than a refraction index of the second layer and the light emitting structure has a greater refraction index than the refraction index of the first layer.

It will be understood that when an element is referred to as being "on" or "under" another element, it can be directly on/under the element, and one or more intervening elements may also be present. When an element is referred to as being "on" or "under", "under the element" as well as "on the element" may be included based on the element.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:

a substrate; and a light extraction layer provided over the substrate, the light extraction layer having a refraction index higher than a refraction index of the substrate and lower than a refraction index of a light emitting structure and including a first surface contacting the substrate and a second surface provided opposite to the first surface, wherein the first surface has a greater area than an area of the second surface, wherein the light extraction layer includes first, second, and third layers, wherein the first, second, and third layers each contact a continuous substantially planar upper surface of the substrate, wherein the first layer is provided over the second layer and has a side surface contacting a side surface of the second layer, wherein the second layer is provided over the third layer and has a side surface contacting a side surface of the third layer, wherein the light emitting structure is provided over the light extraction layer, wherein the first, second, and third layers include a plurality of light extraction structures, and wherein at least one of the light extraction structures has a tetrahedral shape, and wherein the light emitting structure includes a first conductive type semiconductor layer, a second conductive type semiconductor layer, and an active layer therebetween.

2. The light emitting device according to claim 1, wherein the first, second, and third layers include the plurality of light extraction structures and each light extraction structure includes a first region contacting the substrate and a second region provided opposite to the first region, wherein the first region has a greater cross-sectional area than a cross-sectional area of the second region.

3. The light emitting device according to claim 2, wherein each light extraction structure has a height of 1 micrometer to 2 micrometers.

4. The light emitting device according to claim 2, wherein the light extraction structures are spaced from one another by a predetermined distance of 1 micrometer to 2 micrometers.

5. The light emitting device according to claim 2, wherein a difference in distances between the light extraction structures is 0.5 micrometers or less.

6. The light emitting device according to claim 2, wherein each light extraction structure has, in the first region, a width of 2 to 3 micrometers and a length of 2 to 3 micrometers.

7. The light emitting device according to claim 1, further including a reflective layer provided between the light extraction layer and the light emitting structure.

8. The light emitting device according to claim 1, wherein the first layer has a higher refraction index than a refraction index of the second layer.

9. The light emitting device according to claim 1, wherein the light extraction layer is a distributed Bragg reflector layer.

10. The light emitting device according to claim 1, wherein the light extraction layer contains at least one of AlN, SiN, $Ta_2O_5$, $ZrO_2$, and $HfO_2$.

11. The light emitting device of claim 1, wherein the first, second, and third layers include a plurality of light extraction structures, wherein at least one of the light extraction structures has a hexahedral shape having a trapezoidal cross-section, and wherein the trapezoidal cross-section is perpendicular to a top surface of the substrate and has two adjacent acute angles.

12. The light emitting device of claim 11, wherein the first, second, and third layers include a plurality of light extraction structures, and wherein at least one of the light extraction structures has a tetrahedral shape.

13. The light emitting device of claim 1, wherein the first, second, and third layers each have a top surface that extends substantially parallel to the substrate.

14. A light emitting device comprising:

a substrate;

a light extraction layer provided over the substrate, wherein the light extraction layer has a refraction index higher than a refraction index of the substrate and lower than a retraction index of a light emitting structure, wherein the light extraction layer includes first, second, and third layers, wherein the first, second, and third layers each contact a continuous substantially planar upper surface of the substrate, wherein the first layer is provided over the second layer and has a side surface contacting a side surface of the second layer, and wherein the second layer is provided over the third layer and has a side surface contacting a side surface of the third layer; and a reflective layer provided between the light extraction layer and the light emitting structure to cover the light extraction layer and expose the substrate between neighboring light extraction structures of the light extraction layer, in order to separate the light emitting structure from the light extraction layer and contact the light emitting structure to the substrate, wherein the light emitting structure is provided over the reflective layer, and wherein the light emitting structure includes a first conductive type semiconductor layer, a second conductive type semiconductor layer, and an active layer therebetween.

15. The light emitting device according to claim 14, wherein the light extraction layer has a side surface and an upper surface, each contacting the reflective layer.

16. The light emitting device according to claim 14, wherein the first layer has a higher refraction index than a refraction index of the second layer.

17. The light emitting device according to claim 14, wherein the first layer has a lower refraction index than a refraction index of the light emitting structure.

18. The light emitting device according to claim 14, wherein the second layer has a higher refraction index than a refraction index of the substrate.

19. The light emitting device according to claim 14, wherein the light emitting structure has a configuration in which portions of the second conductive type semiconductor layer, the active layer, and the first conductive type semiconductor layer are etched to expose a surface of the first conductive type semiconductor layer, and the light extraction layer is provided under a region corresponding to an upper surface of the second conductive type semiconductor layer and wider a region corresponding to the etched and exposed surface of the first conductive type semiconductor layer.

20. The light emitting device according to claim 14, wherein a height of the first layer is identical to a height of the second layer.

21. The light emitting device of claim 14, wherein the reflective layer contacts the substrate.

22. The light emitting device of claim 14, wherein the reflective layer has a refraction index lower than a refraction index of the light emitting structure and higher than a refraction index of the first layer.

23. A light emitting device comprising:

a substrate;

a light extraction layer including first, second, and third layers, wherein the first, second, and third layers each contact the substrate, wherein the first layer is provided over the second layer and has a side surface contacting a side surface of the second layer, and wherein the second layer is provided over the third layer and has a side surface contacting a side surface of the third layer; and a light emitting structure provided on the light extraction layer, the light emitting structure including a first conductive type semiconductor layer, a second conductive type semiconductor layer, and an active layer, wherein the third layer has a higher refraction index than a refraction index of the substrate, the second layer has a higher refraction index than the refraction index of the third layer, the first layer has a higher refraction index than the refraction index of the second layer, and the refraction index of the first layer is lower than a refraction index of the light emitting structure.

* * * * *